(12) United States Patent
Matsumoto et al.

(10) Patent No.: US 12,725,632 B2
(45) Date of Patent: Sep. 1, 2026

(54) MAGNETIC STORAGE DEVICE PROVIDED WITH MAGNETORESISTIVE ELEMENT

(71) Applicant: NATIONAL INSTITUTE OF ADVANCED INDUSTRIAL SCIENCE AND TECHNOLOGY, Tokyo (JP)

(72) Inventors: Rie Matsumoto, Tsukuba (JP); Shinji Yuasa, Tsukuba (JP); Hiroshi Imamura, Tsukuba (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 164 days.

(21) Appl. No.: 18/696,602

(22) PCT Filed: Oct. 11, 2022

(86) PCT No.: PCT/JP2022/037771
§ 371 (c)(1),
(2) Date: Mar. 28, 2024

(87) PCT Pub. No.: WO2023/149019
PCT Pub. Date: Aug. 10, 2023

(65) Prior Publication Data

US 2024/0395283 A1 Nov. 28, 2024

(30) Foreign Application Priority Data

Feb. 4, 2022 (JP) ................................ 2022-016669

(51) Int. Cl.
*G11B 5/39* (2006.01)
*G11C 11/16* (2006.01)
(Continued)

(52) U.S. Cl.
CPC ............ *G11B 5/3909* (2013.01); *G11C 11/16* (2013.01); *G11C 11/161* (2013.01);
(Continued)

(58) Field of Classification Search
CPC . G11B 5/3909; G11C 11/161; G11C 11/1675; G11C 11/1659; G11C 11/16;
(Continued)

(56) References Cited

U.S. PATENT DOCUMENTS

2010/0238711 A1* 9/2010 Asao ...................... G11C 11/16 365/148
2012/0244640 A1* 9/2012 Ohsawa ................ H10N 50/01 257/E43.006
(Continued)

FOREIGN PATENT DOCUMENTS

JP 2014-067929 A 4/2014
JP 2017-157662 A 9/2017
(Continued)

OTHER PUBLICATIONS

International Search Report from International Application No. PCT/JP2022/037771 mailed Dec. 27, 2022.
(Continued)

*Primary Examiner* — Alexander Sofocleous
*Assistant Examiner* — Joseph Fidelis Stormes
(74) *Attorney, Agent, or Firm* — Shih IP Law Group, PLLC

(57) ABSTRACT

Provided is a magnetic storage device 10 comprising: a magnetoresistive element 11 having a structure in which a recording layer 13 that includes a first magnetic layer, a tunnel barrier layer 14, and a reference layer 15 that includes a second magnetic layer are laminated; and a control unit 12, wherein the in-plane shape of the recording layer 13 is such that a rectangle circumscribing the in-plane shape and
(Continued)

having the smallest area has a short side and a long side which have mutually different lengths, and at the time of writing to the recording layer 13, the control unit 12 applies a voltage pulse to the magnetoresistive element 11 while applying an effective magnetic field in the direction of the short side in the plane of the recording layer 13.

18 Claims, 8 Drawing Sheets

(51) Int. Cl.

*H01F 10/32* (2006.01)
*H10B 61/00* (2023.01)
*H10N 50/10* (2023.01)
*H10N 50/85* (2023.01)

(52) U.S. Cl.

CPC ...... *G11C 11/1659* (2013.01); *G11C 11/1675* (2013.01); *H01F 10/3286* (2013.01); *H10B 61/00* (2023.02); *H10B 61/22* (2023.02); *H10N 50/10* (2023.02); *H10N 50/85* (2023.02)

(58) Field of Classification Search

CPC ..... H01F 10/3286; H10B 61/00; H10B 61/22; H10N 50/10; H10N 50/85

See application file for complete search history.

(56) References Cited

U.S. PATENT DOCUMENTS

2014/0085969 A1* 3/2014 Saida .................. G11C 11/1675 365/158
2018/0158525 A1 6/2018 Nozaki
2019/0096957 A1 3/2019 Uchida
2020/0035280 A1 1/2020 Sugiyama
2020/0052193 A1 2/2020 Matsumoto

FOREIGN PATENT DOCUMENTS

JP 2018-014376 A 1/2018
JP 2020-021782 A 2/2020
WO 2018198713 A1 11/2019

OTHER PUBLICATIONS

Y. Shiota, et al., Reduction in write error rate of voltage-driven dynamic magnetization switching by improving thermal stability factor, Appl. Phys. Lett. 111, 022408 (2017).

Notice of the Reasons for Refusal for the Corresponding JP Patent Application No. 2022-016669 by the JPO dated Jan. 14, 2025.

* cited by examiner

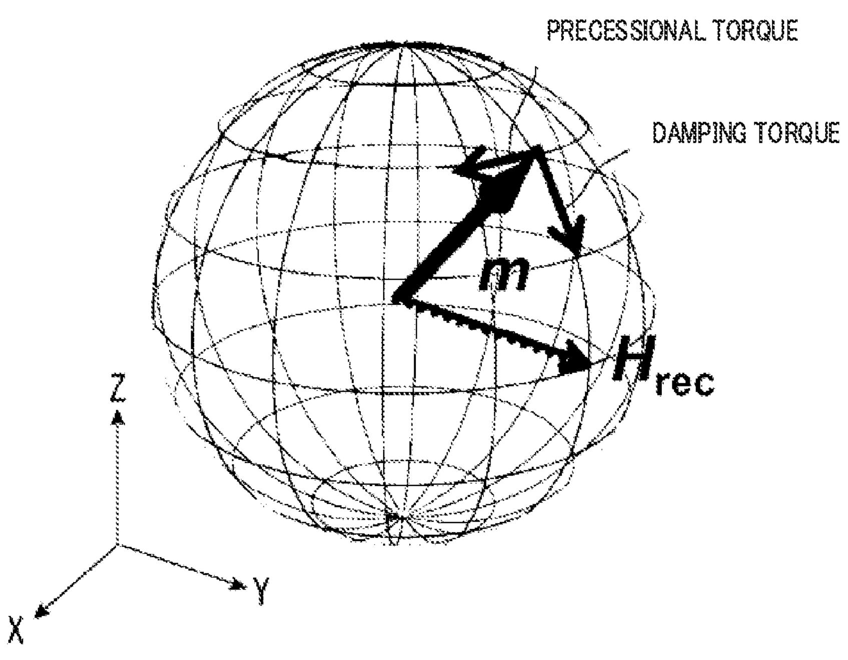
FIG. 3
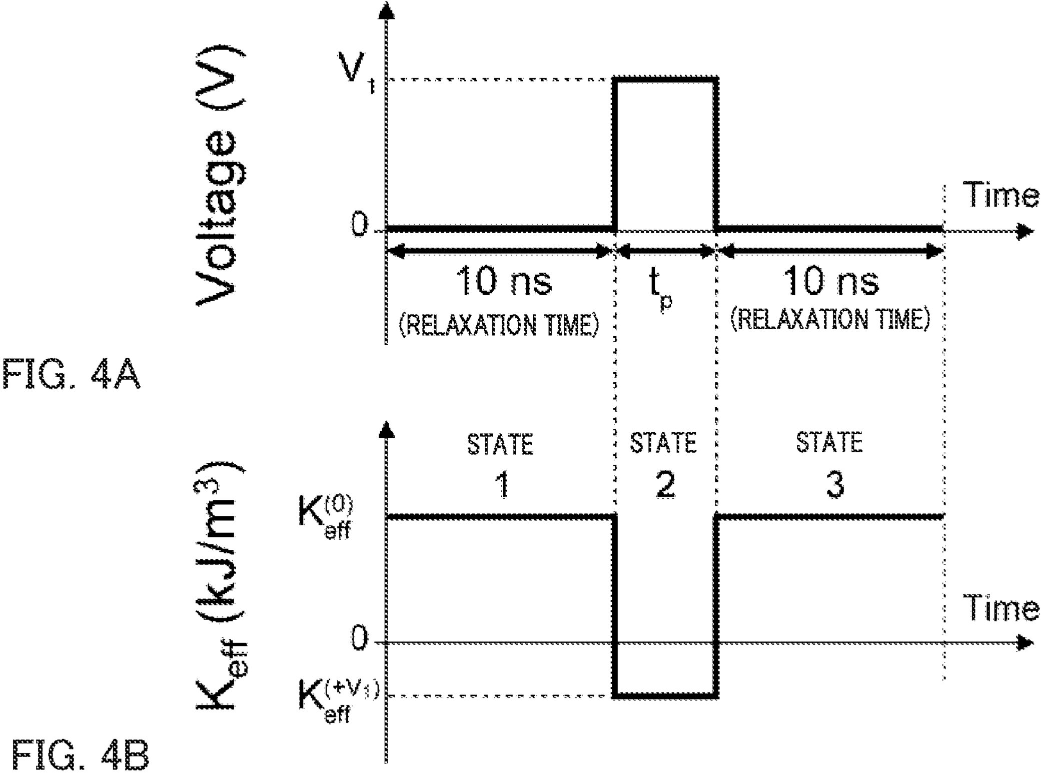
FIG. 4A
FIG. 4B

MAGNETIC STORAGE DEVICE PROVIDED WITH MAGNETORESISTIVE ELEMENT

TECHNICAL FIELD

The present disclosure relates to a magnetic storage device provided with a magnetoresistive element of a thin-film stacked body including a magnetic thin film.

BACKGROUND ART

The magnetoresistive element is an element formed of a stacked body of a magnetization fixed layer, an intermediate layer, and a magnetization free layer. The magnetoresistive element has a characteristic that the resistance value changes depending on relative angles between the magnetizations of the magnetization fixed layer and the magnetization free layer. The magnetoresistive element provided with a magnetic anisotropy is capable of providing the magnetization free layer with maximum and minimum values of energy with respect to the angles between the magnetizations. For example, in a case where the magnetizations of the magnetization fixed layer and the magnetization free layer have a uniaxial and positive anisotropy, the magnetization energy becomes minimum when the relative angles between the magnetizations are parallel or antiparallel, and two stable states can be taken. The resistance value of the magnetoresistive element becomes lowest when the orientations of the magnetization are parallel, and becomes highest when the directions of the magnetization are antiparallel. In a case where the magnetoresistive element is applied as a memory, the magnetization free layer is used as a recording layer.

In a voltage-induced writing scheme, the orientation of the magnetization of the magnetization free layer in the recording layer can be reversed by applying a voltage pulse to the magnetoresistive element. This is a phenomenon called voltage-induced magnetization switching. A non-volatile memory using this switching as a data writing method is a voltage-controlled magnetoresistive memory (VC-MRAM). The voltage-induced magnetization switching is high-speed and extremely low-power-consuming switching that involves the transition between two magnetization states separated by an energy barrier of tens of $k_BT$, and this transition is induced by applying a voltage pulse having a duration of a sub-nanosecond to several nanoseconds to lower the energy barrier.

CITATION LIST

Patent Literature

Patent Literature 1
US Patent Application Publication No. 2018/0158525

Non-Patent Literature

Non-Patent Literature 1
Y. Shiota, et al., Appl. Phys. Lett. 111, 022408 (2017)

SUMMARY OF INVENTION

Technical Problem

In the voltage-induced writing scheme, one cause of a write error is thermal fluctuation to which the magnetization of a recording layer is subjected in the initial state before writing and in the final state after writing, and the magnetization deviates from the direction in the equilibrium state at absolute zero and the orientation thereof varies. For suppressing variations in the orientation of the magnetization, an increase in the perpendicular magnetic anisotropy of the recording layer has been considered, and a reverse bias method has been proposed (for example, see Patent Literature 1). The reverse bias method applies, before and after applying a write voltage for magnetization switching in a recording layer, a bias voltage having a polarity, which is the reverse of the polarity of the write voltage, to a magnetoresistive element. When the bias voltage is applied, the perpendicular magnetic anisotropy energy increases and acts in a direction perpendicular to the film surface, and thus, the thermal energy becomes relatively small and variations in the orientation of the magnetization are suppressed. In the reverse bias method, however, an unfavorable phenomenon of an increased power consumption occurs since the voltage is applied to the magnetoresistive element from before the writing to after the writing.

Another cause of a write error is thermal agitation to which the magnetization of a recording layer in which precessional switching occurs during writing is subjected, in which case the orientation of the magnetization may not be reversed in the final state. For suppressing the effect of thermal agitation, it is reported that a write error rate can be reduced by increasing an external magnetic field to be applied in a direction parallel to the film surface of a recording layer (for example, see Non-Patent Literature 1). In this method, as the external magnetic field increases, the voltage pulse duration can be decreased, which makes it possible to perform high-speed and low-power-consuming writing. However, an unfavorable phenomenon of being incapable of reducing the write error rate sufficiently occurs in a case where the external magnetic field is excessively large in comparison with the perpendicular magnetic anisotropy energy.

An object of the present disclosure is to provide a magnetic storage device that enables high-speed and low-power-consuming writing and is capable of reducing the write error rate.

Solution to Problem

An aspect of the present disclosure provides a magnetic storage device including: a magnetoresistive element including a stacked structure of a recording layer including a first magnetic layer, a tunnel barrier layer, and a reference layer including a second magnetic layer; and a control unit. An in-plane shape of the recording layer is a shape in which a rectangle circumscribing the in-plane shape and having a minimum area includes a short side and a long side which have mutually different lengths. When writing to the recording layer is performed, the control unit applies a voltage pulse to the magnetoresistive element while applying an effective magnetic field in a direction of the short side in a plane of the recording layer.

According to the above aspect, the recording layer of the magnetoresistive element has the shape in which the rectangle circumscribing the in-plane shape thereof and having the minimum area includes the short side and the long side which have mutually different lengths, and the control unit applies the voltage pulse to the magnetoresistive element while applying the effective magnetic field in the direction of the short side in the plane of the recording layer, thereby enabling high-speed and low-power-consuming writing and being capable of reducing the write error rate by suppressing thermal fluctuation in the magnetization of the recording layer before and after the writing and suppressing influence of thermal agitation during the writing, due to a shape magnetic anisotropy of the recording layer.

BRIEF DESCRIPTION OF DRAWINGS

FIG. 3 is an explanatory diagram of a behavior of the magnetization of the recording layer of the magnetoresistive element;

FIGS. 4A and 4B are explanatory diagrams of a sequence of a writing model of voltage pulse application;

DESCRIPTION OF EMBODIMENTS

Hereinafter, embodiments of the present disclosure will be described with reference to the accompanying drawings. Note that, common elements between a plurality of drawings will be denoted with the same reference signs, and repetitions of detailed descriptions of the elements will be omitted.

Embodiment 1

Figure 1:
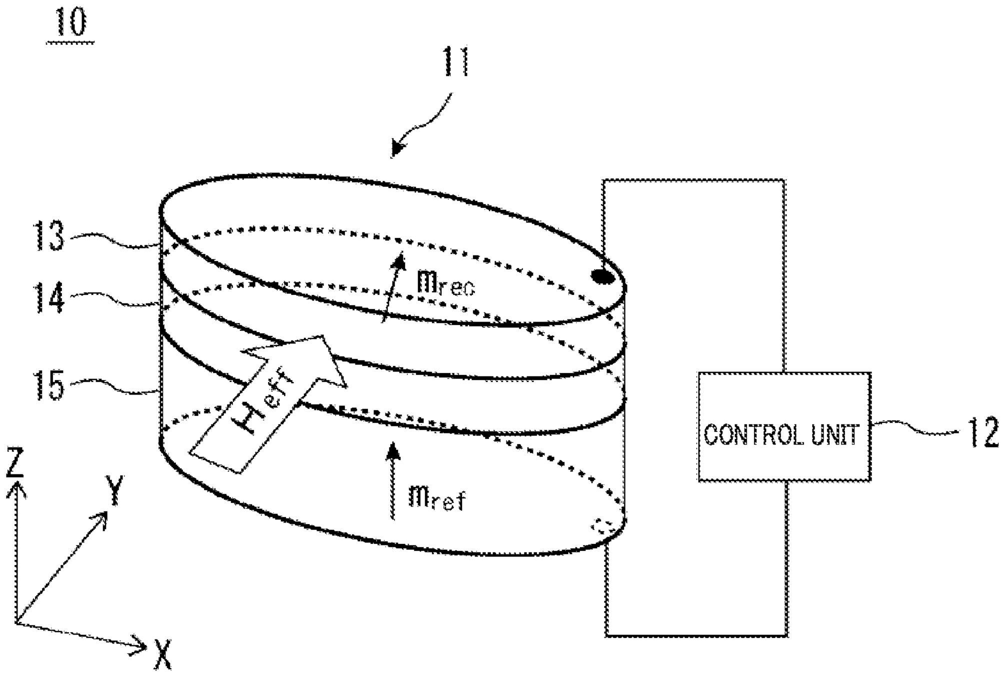
FIG. 1 is a schematic diagram of a main part of a magnetic storage device according to Embodiment 1.
Figure 2:
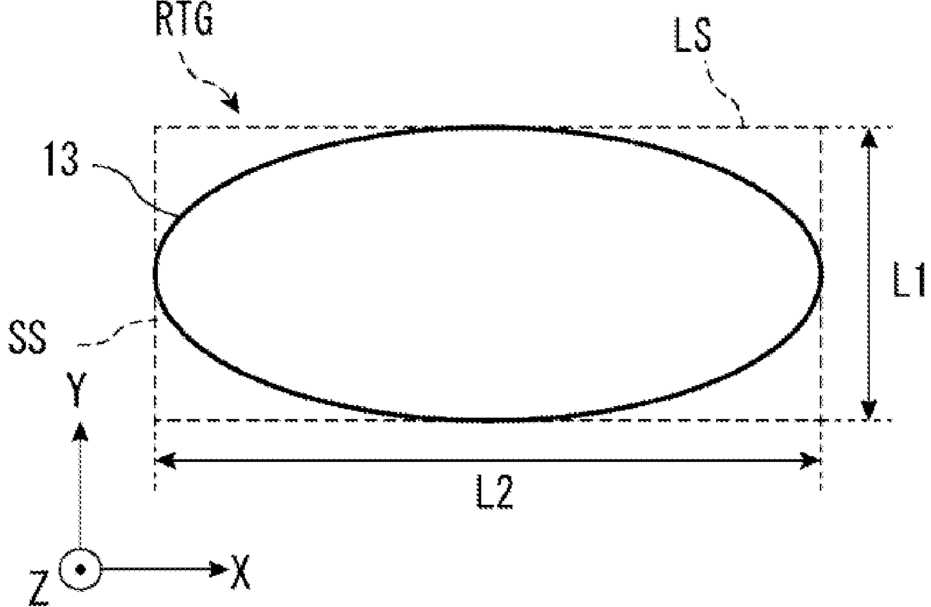
FIG. 2 is a plan view of a recording layer of the magnetoresistive element, which is provided for describing an in-plane shape.

FIG. 1 is a schematic diagram of a main part of a magnetic storage device according to Embodiment 1. FIG. 2 is a plan view of a recording layer of the magnetoresistive element, which is provided for describing an in-plane shape. The XY plane in FIGS. 1 and 2 is a plane parallel to the in-plane of the recording layer. The X axis is a long axis direction of the elliptical in-plane shape of the recording layer, the Y axis is a short axis direction of the elliptical in-plane shape of the recording layer, and the Z axis is a direction perpendicular to the recording layer.

Referring to FIGS. 1 and 2, a magnetic storage device 10 includes: a magnetoresistive element 11 that stores information by utilizing two stable magnetization states; and a control unit 12 that applies a voltage pulse to the magnetoresistive element 11 to perform writing of information and controls reading. The magnetoresistive element 11 includes: a recording layer 13; a reference layer 15; and a tunnel barrier layer 14 held between the recording layer 13 and the reference layer 15.

Unlike the conventional writing scheme using a magnetic field, which is the so-called Toggle magnetoresistive memory (Toggle MRAM), and the conventional writing scheme using a current, which is the so-called Spin Torque write-type magnetic memory (STT-RAM), the magnetic storage device 10 in the present embodiment is a voltage-controlled magnetic memory (VC-MRAM) that reverses the direction of the magnetization of the recording layer 13 by applying a voltage pulse to the magnetoresistive element 11. In the magnetic storage device 10, magnetization switching with a low Joule loss occurs by controlling the height of an energetic barrier present between two stable magnetization states of the recording layer 13 by using a short voltage pulse with orders of sub-nanoseconds to nanoseconds, and therefore the magnetic storage device 10 enables high-speed and low-power consuming writing.

For voltage-induced magnetization switching, the magnetic storage device 10 applies, for example, an effective magnetic field in a predetermined direction in a plane of the recording layer 13 at the time of writing. Note that, the effective magnetic field may be being applied not only at the time of writing but also other than the time of writing. The predetermined direction of the effective magnetic field is the direction of the short side (the Y axis direction) of the in-plane shape. The direction of the short side will be described below. In the in-plane shape of the recording layer 13 illustrated in FIG. 2, a rectangle RTG circumscribing the in-plane shape (contour) and having a minimum area is uniquely determined. The in-plane shape of the recording layer 13 is a shape including a short side SS and a long side LS of the rectangle RTG, where the short side SS and the long side LS have mutually different lengths, and does not encompass a case where the short side SS and the long side LS have the same length, in other words, a case where the rectangle RTG is a square. As described above, the effective magnetic field is applied in the direction of the short side (the SS direction) of the rectangle RTG specified in the above-described manner with respect to the in-plane shape of the recording layer 13.

When the magnetoresistive element 11 illustrated in FIG. 1 has a three-dimensional shape of an elliptical cylinder as an example, the in-plane shape of the recording layer 13 has an elliptical shape as illustrated in FIG. 2, and the short axis of the elliptical shape corresponds to the short side SS of the rectangle RTG, and the long axis of the elliptical shape corresponds to the long side LS of the rectangle RTG. Even in a case where the recording layer 13 is affected during the manufacturing process or the like and the in-plane shape thereof is deformed, the effective magnetic field is applied in the direction of the short side of the rectangle specified in the above-described manner.

A longer length of the short side SS is preferable in terms of making the volume of the recording layer 13 larger and leading to an increased storage stability, but is not preferable in terms of reducing the number of elements, which can be disposed on one substrate, due to an increased element area and decreasing the memory capacity per unit area. For this reason, the length of the short side SS is preferably equal to or greater than 5 nm and equal to or less than 500 nm, and more preferably equal to or greater than 10 nm and equal to or less than 300 nm.

The effective magnetic field is a part of a magnetic field acting on a magnetization $m_{rec}$ of the recording layer 13 and is a synthetic magnetic field of an external magnetic field applied from outside of the magnetoresistive element 11, a magnetic field due to an induced magnetic anisotropy of the recording layer 13, a magnetic field due to interlayer exchange coupling, an exchange bias magnetic field, a leakage magnetic field from a magnetic layer other than the recording layer 13, and/or the like.

As the external magnetic field applied from outside of the magnetoresistive element 11, a permanent magnet may be disposed in the vicinity of the magnetoresistive element 11 and a static magnetic field of the permanent magnet may be used. Further, a magnetic field generated by disposing wiring in the vicinity of the magnetoresistive element 11 and passing a direct current through the wiring may also be used.

The induced magnetic anisotropy of the recording layer 13 is a magnetic anisotropy formed in a case where the recording layer 13 is deposited in a magnetic field or in a case where the recording layer 13 is thermally treated in a magnetic field. In a case where the recording layer 13 is formed of a material in which at least one element from the group consisting of B, C, N, Si, P, and Cr is added to Fe, Co, Ni, and an alloy formed of these elements, the induced magnetic anisotropy is generated by performing the deposition in a magnetic field or the thermal treatment in a magnetic field. In the recording layer 13, an inner magnetic field due to the induced magnetic anisotropy is generated.

The interlayer exchange coupling is a phenomenon in which a magnetic field occurs between the magnetization of a magnetization fixed layer provided on a side of the recording layer 13 opposite to the reference layer 15 via a non-magnetic layer and the magnetization of the recording layer 13 and the magnetization of the magnetization fixed layer. For this phenomenon, the magnetization of the recording layer 13 will be antiparallel or parallel to each other. The magnetic field due to the interlayer exchange coupling is a magnetic field that occurs in the recording layer 13 by this action.

The exchange bias magnetic field is a magnetic field to which the recording layer 13 is subjected from a bias layer provided in contact with the side of the recording layer 13 opposite to the reference layer 15. The bias layer is formed of an alloy containing at least one element selected from the group consisting of Cr, Mn, Fe, Co, and Ni and at least one element selected from the group consisting of Ru, Rh, Pd, Ag, Os, Ir, Pt, and Au. This alloy preferably has antiferromagnetism. Examples of the alloy constituting the bias layer include a Pt—Mn alloy, an Ir—Mn alloy, and a Fe—Mn alloy.

The leakage magnetic field from a magnetic layer other than the recording layer 13 is a magnetic field leaking from a magnetic layer other than the recording layer 13. A magnetic layer for generating a leakage magnetic field may be provided as a part of the stacked body of the magnetoresistive element 11.

Besides the effective magnetic field, a perpendicular anisotropy field and a magnetic field due to a shape magnetic anisotropy also act on the magnetization $m_{rec}$ of the recording layer 13. The magnetic field due to a shape magnetic anisotropy is a magnetic field caused by the in-plane shape of the recording layer 13, that is, a demagnetization field. The in-plane shape of the recording layer 13 is a shape in which the rectangle RTG circumscribing the in-plane shape and having a minimum area includes the short side SS and the long side LS which have mutually different lengths. In the case of such a shape and in a case where the recording layer 13 is magnetized, a demagnetization field as an inner magnetic field occurs in a direction opposite to the magnetization.

The recording layer 13 and the reference layer 15 in the magnetoresistive element 11 are magnetic layers. The magnetic layers contain, for example, at least one element selected from the group consisting of Fe, Co, Ni, Cr, Mn, Gd, Nd, Sm, and Tb. The thickness of the magnetic layers is preferably set, for example, in a range of equal to or greater than 0.5 nm and equal to or less than 10 nm.

The recording layer 13 includes a magnetic layer (referred to as a magnetization free layer) in which the direction of the magnetization $m_{rec}$ is more likely to change than a magnetization $m_{ref}$ of the reference layer 15. The reference layer 15 includes a magnetization fixed layer in which the magnetization direction is hard to change.

The recording layer 13 preferably has a perpendicular magnetic anisotropy. In a state in which no voltage pulse is applied, the magnetization of the recording layer 13 is oriented toward a direction inclined in a perpendicular direction from the film surface due to competition between the perpendicular magnetic anisotropy and the effective magnetic field.

It is preferred that the recording layer 13 be a magnetic layer containing Co, for example, Co—Fe—B, in terms of exhibiting a relatively larger magnetoresistance effect than other magnetic materials.

As the recording layer 13, it is possible to use a stacked body in which a magnetic layer containing Co and a magnetic layer containing at least one of Pt and Pd are stacked. As the recording layer 13, it is possible to use a stacked body in which a magnetic layer containing Co and a magnetic layer containing at least one of Pt and Pd are alternately stacked.

The reference layer 15 may include ferromagnetic layer/intermediate layer/ferromagnetic layer in a synthetic antiferromagnetic (SAF) structure. The SAF structure is a structure in which two ferromagnetic layers are coupled antiferromagnetically and the magnetizations are oriented antiparallel. The intermediate layer is a thin-film conductive layer. The orientation of the magnetization of the reference layer 15 is fixed in the same direction with substantially no temporal change. What is referred to as a perpendicular magnetization film is a magnetization film in a case where the orientation of the magnetization coincides with the stacking direction, and what is referred to as an in-plane magnetization film is a magnetization film in a case where the orientation of the magnetization is orthogonal to the stacking direction. The reference layer 15 is, for example, a perpendicularly magnetized stacked film containing Co—Fe—B/Ru layer/stacked film containing CoPt in order close to the tunnel barrier layer 14.

The tunnel barrier layer 14 is disposed between the recording layer 13 and the reference layer 15. As the tunnel barrier layer 14, it is possible to use one of an insulator, semiconductor and dielectric of a non-magnetic material, all of which are known as a tunnel barrier layer. The tunnel barrier layer contains, for example, an oxide, nitride, or fluoride containing at least one element selected from the group consisting of Mg, Si, Al, Ti, Zr, Hf, Ta, Zn, Sr, Bi, and Ba. Specific examples thereof include $Al_2O_3$, $SiO_2$, MgO, AlN, Ta—O, Al—Zr—O, $Bi_2O_3$, $MgF_2$, $CaF_2$, $SrTiO_3$, $AlLaO_3$, Al—N—O, and Si—N—O. As the tunnel barrier layer 14, for example, a non-magnetic semiconductor (ZnOx, InMn, GaN, GaAs, TiOx, Zn, Te, or one of these doped with a transition metal) can also be used.

The tunnel barrier layer 14 is preferably an oxide containing Mg in terms of exhibiting a relatively larger magnetoresistance effect than other above-described materials. The tunnel barrier layer 14 is more preferably an oxide containing Mg and Al in terms of exhibiting a much larger magnetoresistance effect.

In terms of suppressing Joule loss, the thickness of the tunnel barrier layer 14 is preferably equal to or greater than 1.2 nm, more preferably equal to or greater than 1.3 nm, even more preferably equal to or greater than 1.4 nm, still more preferably equal to or greater than 1.5 nm, and particularly preferably equal to or greater than 1.6 nm. The thickness of the tunnel barrier layer 14 is preferably equal to or less than 4 nm in terms of high-speed reading.

A simulation for the magnetic storage device 10 in the present embodiment is conducted. In the simulation, the Langevin equation in following Equation 1 which indicates the time evolution of the direction of the magnetization (unit vector $m=(m_x, m_y, m_z)=(\sin\theta\cos\varphi, \sin\theta\sin\varphi, \cos\theta)$) of the recording layer 13 illustrated in FIG. 1 is used.

[1]

$$(1+\alpha^2)\frac{dm}{dt} = -\gamma_0 m\times\{(H_{rec}+h)+\alpha[m\times(H_{rec}+h)]\} \quad \text{(Equation 1)}$$

where α is the Gilbert damping constant, $\gamma_0$ is the gyromagnetic ratio, $H_{rec}$ is a synthetic magnetic field (vector) obtained by synthesizing every magnetic field acting on the recording layer 13, and h is a thermal-agitation magnetic field (vector). The thermal-agitation magnetic field h satisfies the relations in following Equation 2.

[2]

$$\langle h_\iota(t)\rangle = 0,$$
$$\langle h_\iota(t)h_\kappa(t')\rangle = [2\alpha k_B T/(\gamma_0\mu_0 M_s V_F)]\delta_{\iota\kappa}\delta(t-t') \quad \text{(Equation 2)}$$

where subscripts ι, K=x, y, z, $k_B$ is the Boltzmann constant, T is the absolute temperature, $\mu_0$ is the permeability, $M_s$ is the saturation magnetization, $V_F$ is the volume of the recording layer 13, $\delta_{\iota K}$ is the Kronecker delta, δ(t−t') is the Dirac delta function, < > represents the time average, and t and t' are clock times. The latter half of Equation 2 means that a random magnetic field at a given clock time t is independent of a random magnetic field at another clock time t' and that there is no correlation therebetween in a case where the components L and K of the random magnetic fields differ.

The synthetic magnetic field $H_{rec}$ is defined by following Equation 3.

[3]

$$H_{rec} = -\frac{1}{\mu_0 M_s}\nabla E \quad \text{(Equation 3)}$$

where ∇(nabra) is the vector operator that determines the gradients in the X, Y, and Z axis directions. E is the energy density and is given by following Equation 4.

[4]

$$E(m_x, m_y, m_z) = \frac{1}{2}\mu_0 M_s^2(N_x m_x^2 + N_y m_y^2 + N_z m_z^2) + K_u(1-m_z^2) - \mu_0 M_s m\cdot H_{eff} \quad \text{(Equation 4)}$$

where the first term on the right side is the demagnetization energy, the second term on the right side is the anisotropy energy, and the third term on the right side is the Zeeman energy, and $(N_x, N_y, N_z)$ represent the demagnetizing factors, $K_u$ represents the perpendicular magnetic anisotropy constant, and $H_{eff}$ represents the effective magnetic field. According to Equations 3 and 4 described above, the synthetic magnetic field $H_{rec}$ acts on the magnetization of the recording layer 13, and in the equilibrium state, the magnetization of the recording layer 13 is oriented toward direction $m^{(0)}=(m_x^{(0)}, m_y^{(0)}, m_z^{(0)})$ in which the energy density is minimum.

FIG. 3 is an explanatory diagram of a behavior of the magnetization of the recording layer of the magnetoresistive element. The X direction is a direction of the long axis (long side) of the recording layer 13, and the Y direction is a direction of the short axis (short side) of the recording layer 13. The magnetization m is a unit vector indicating the direction of the magnetization. Referring to FIG. 3 together with FIG. 1, it is assumed that the effective magnetic field $H_{eff}$ is applied in the Y axis direction, and that the Z component in the magnetization m of the recording layer is positive ($m_z>0$) in the initial state of writing. As illustrated in FIG. 3, when the direction of the magnetization of the recording layer 13 is expressed with a spherical coordinate system, the direction of the magnetization of the recording layer 13 tilts in the latitudinal direction away from the Z axis direction with an angle θ. The torques that act during voltage pulse application are indicated with the arrow starting from the tip of the arrow of the magnetization m. On the magnetization m, damping torque acts in a direction toward the synthetic magnetic field $H_{rec}$, and precessional torque acts in a direction of rotating the magnetization around the synthetic magnetic field $H_{rec}$.

The sequence of a writing model of voltage pulse application to the magnetoresistive element 11 is set as follows. The write error rate of this writing model is calculated by a simulation using the Langevin equation in Equation 1 described above.

FIGS. 4A and 4B are explanatory diagrams of a sequence of a writing model of voltage pulse application. The horizontal axis in FIGS. 4A and 4B represents time. The vertical axis in FIG. 4A represents the voltage to be applied to the magnetoresistive element 11. The vertical axis in FIG. 4B represents an effective perpendicular magnetic anisotropy constant $K_{eff}$ acting on the recording layer 13, where $K_{eff}=K_u-(½)\mu_0 M_s^2(N_z-N_x)$.

First, assuming that the voltage to be applied to the magnetoresistive element 11 is zero and $m_z>0$ at the temperature of 0 K (Kelvin), the direction of the magnetization m in the equilibrium state is determined with a simulation. Next, FIGS. 4A and 4B are referred to. As illustrated in FIG. 4A, after relaxation for 10 nanoseconds (ns) at room temperature (300 K) in STATE 1 in which the voltage applied to the magnetoresistive element 11 is zero, a voltage pulse (a duration $t_p$, an applied voltage $V_1$) is applied to the magnetoresistive element 11 (STATE 2), followed by relaxation for 10 nanoseconds (ns) relaxation in STATE 3 in which the applied voltage is zero. As illustrated in FIG. 4B, the magnetization m is calculated with the effective perpendicular magnetic anisotropy constant $K_{eff}$ as follows. The effective perpendicular magnetic anisotropy constant $K_{eff}$ in STATES 1 and 3 is assumed to be $K_{eff}^{(0)}$, and the effective perpendicular magnetic anisotropy constant $K_{eff}$ in STATE 2 is assumed to be $K_{eff}^{(+V_1)}$. In a case where the magnetization m at the time when relaxation for 10 ns in STATE 3 ends is $m_z<0$, it is determined that magnetization switching has occurred. In the case of $m_z>0$, a write error is determined since magnetization switching has not occurred in the end. The write error rate is defined as (the frequency of errors)/the number of trials. In this calculation example, the number of trials is assumed to be $10^5$ to $10^6$ times.

In the simulation for the magnetic storage device according to Embodiment 1, the following various parameters are applied with respect to the magnetoresistive element 11 and writing conditions.

Figures 5A, 5B, 5C:
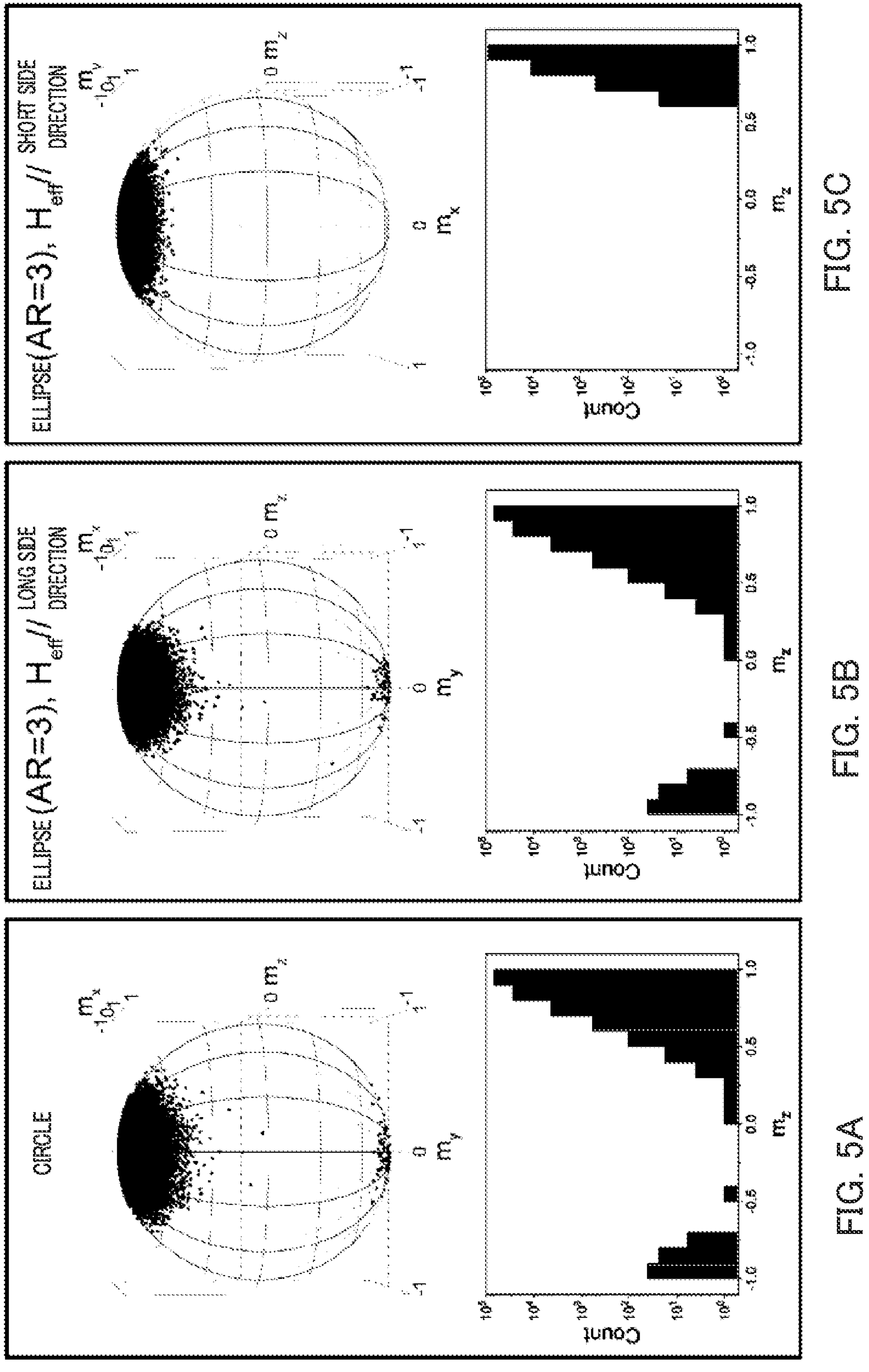
FIGS. 5A to 5C illustrate distribution calculation examples in initial states of the magnetization of the recording layer of the magnetoresistive element.

- Film thickness of the recording layer: 1.1 nm
- Junction area of the magnetoresistive element: $289\pi$ nm$^2$ ($=17^2\pi$ nm$^2$)
- In-plane shape of the recording layer and aspect ratio (Aspect Ratio (AR)=long axis/short axis):
  - Example 1: circular shape, AR=1 (as a comparative example),
  - Example 2: elliptical shape, AR=2,
  - Example 3: elliptical shape, AR=3, Example 4: elliptical shape, AR=4, Example 5: elliptical shape, AR=5
- Demagnetizing factors ($N_x$, $N_y$, $N_z$)
  - Example 1 (0.04447, 0.04447, 0.91106),
  - Example 2 (0.02608, 0.06836, 0.90556),
  - Example 3 (0.01817, 0.08445, 0.89738),
  - Example 4 (0.013778, 0.096766, 0.889456),
  - Example 5 (0.0110, 0.1069, 0.8821)
- Saturation magnetization $M_s$ of the recording layer: $0.955\times10^6$ A/m
- Magnetic damping constant (Gilbert damping constant): $\alpha=0.1$
- Effective magnetic field $H_{eff}$ (the short axis direction in the plane of the recording layer): 200 Oe to 1600 Oe
- Effective perpendicular magnetic anisotropy constant $K_{eff}$:
  - $K_{eff}^{(0)}=110$ kJ/m$^3$ when the applied voltage is zero,
  - $K_{eff}^{(+V_1)}=-200$ to 50 kJ/m$^3$ when the voltage pulse (applied voltage $V_1$) is applied
- Duration $t_p$ of the voltage pulse: 0.01 ns to 1.00 ns FIGS. 5A to 5C illustrate distribution calculation examples in initial states of the magnetization of the recording layer of the magnetoresistive element. FIGS. 5A to 5C illustrate the distributions of the magnetization of the recording layer 13 just after the STATE 1 illustrated in FIG. 4. The magnetization direction distributions are obtained by performing 0.1 million-time trials of the simulation until the relaxation in STATE 1 and calculating the magnetization direction just after STATE 1 each time, where $K_{eff}^{(0)}=110$ kJ/m$^3$ and $H_{eff}=800$ Oe. FIG. 5A illustrates a time when the effective magnetic field $H_{eff}$ is applied in the in-plane direction in a case where the in-plane shape is that in Example 1, FIG. 5B illustrates a time when the effective magnetic field $H_{eff}$ is applied in the long axis direction in the plane in a case where the in-plane shape is that in Example 3, and FIG. 5C illustrates a time when the effective magnetic field $H_{eff}$ is applied in the short axis direction in the plane in a case where the in-plane shape is that in Example 3. The sphere drawings on the upper panels of FIGS. 5A to 5C illustrate the tip positions of the magnetization m on the spherical surface. In FIGS. 5A and 5B, the depth direction represents the X component of m ($m_x$), the horizontal axis represents the Y component of m ($m_y$), and the vertical axis represents the Z component of m ($m_z$). In FIG. 5C, the depth direction represents the Y component of m ($m_y$), the horizontal axis represents the X component of m ($m_x$), and the vertical axis represents the Z component of m ($m_z$). The drawings on the lower panels of FIGS. 5A to 5C are histograms of $m_z$, and the horizontal axis represents the Z component of m ($m_z$) and the vertical axis represents the count value.

Referring to FIG. 5A, it can be seen that in a case where the in-plane shape of the recording layer 13 is a circle (Example 1), there are, in the sphere drawing and the histogram, trials in which even a state of $m_z$ being minus is present and in which switching occurs within the relaxation time prior to the voltage pulse application. The standard deviation of the Z component $m_z$ of the magnetization m is 0.0800. Referring to FIG. 5B, it can be seen that in a case where the effective magnetic field $H_{eff}$ is applied in the long axis direction even when the recording layer has an in-plane shape with AR=3 (Example 3), there are, in the sphere drawing and the histogram, trials in which even a state of $m_z$ being minus is present and in which switching occurs within the relaxation time prior to the voltage pulse application. The standard deviation of the Z component $m_z$ of the magnetization m is 0.0777. In contrast thereto, referring to FIG. 5C, in a case where the recording layer has an in-plane shape with AR=3 (Example 3) and the effective magnetic field $H_{eff}$ is applied in the short axis direction, no state of $m_z$ being minus is present in the sphere drawing and the histogram. The standard deviation of the Z component $m_z$ of the magnetization m is 0.0389, and it can be seen that variations are extremely smaller than that in Example 1. Further, it can be seen that variations are extremely smaller than the case in Example 3 where the effective magnetic field is applied in the long axis direction in the plane. Thus, it has turned out that the spread of the distribution of the initial state of the magnetization of the recording layer 13 can be suppressed when the in-plane shape of the recording layer 13 is elliptical and the effective magnetic field $H_{eff}$ is applied in the short axis direction in the plane.

Figure 6A:
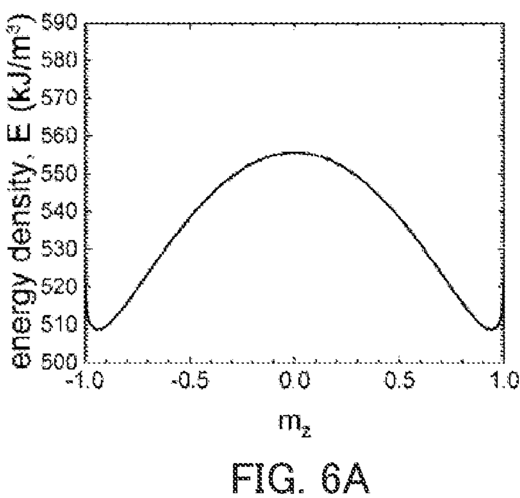
FIGS. 6A and 6B illustrate energy densities in the initial state of the magnetization of the recording layer of the magnetoresistive element.
Figure 6B:
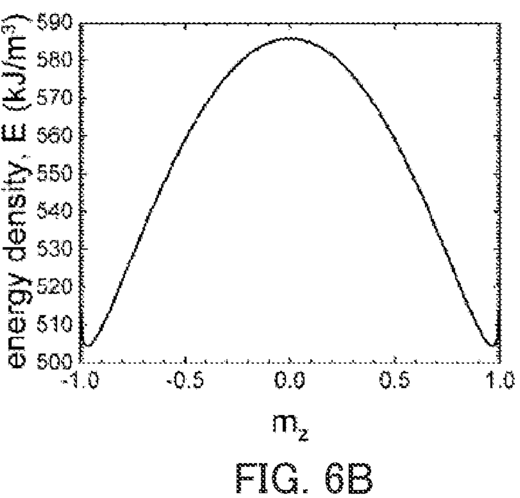

FIGS. 6A and 6B illustrate the energy densities in the initial state of the magnetization of the recording layer of the magnetoresistive element. FIG. 6A illustrates the energy density under the conditions where 800 Oe of the effective magnetic field $H_{eff}$ are applied in the in-plane direction and the in-plane shape of the recording layer is that in Example 1. FIG. 6B illustrates the energy density under the conditions where 800 Oe of the effective magnetic field $H_{eff}$ are applied in the short axis direction in the plane and the in-plane shape of the recording layer is that in Example 3. The horizontal axis represents the Z component $m_z$ of the magnetization of the recording layer, and the vertical axis represents the energy density of the recording layer 13. In FIG. 6A, the effective magnetic field $H_{eff}$ is in the X direction and the magnetization m is hard to be oriented toward the Y direction in the initial state, and thus, plotting is performed with the $m_z$ dependence of the energy density E in Equation 4 at $m_y=0$. In FIG. 6B, the effective magnetic field $H_{eff}$ is in the Y direction and the magnetization m is hard to be oriented toward the X direction in the initial state, and thus, plotting is performed with the $m_z$ dependence of the energy density E in Equation 4 at $m_z=0$.

Referring to FIG. 6A, the energy density takes a minimum value when $m_z$ is in the vicinity of −0.9 and 0.9, and the energy density takes a maximum value when $m_z$ is in the vicinity of 0. The difference between the maximum value and the minimum value is 47 $kJ/m^3$. Referring to FIG. 6B, the energy density takes a minimum value when $m_z$ is in the vicinity of −0.95 and 0.95, and the energy density takes a maximum value when $m_z$ is in the vicinity of 0. The difference between the maximum value and the minimum value is 81 $kJ/m^3$. Given the above, due to the shape magnetic anisotropy, the energy barrier which becomes maximum when $m_z$ is in the vicinity of 0 is higher in a case where the in-plane shape of the recording layer 13 is elliptical and the effective magnetic field $H_{eff}$ is applied in the short axis direction in the plane than in a case where the in-plane shape of the recording layer 13 is circular and the effective magnetic field $H_{eff}$ is applied in the in-plane direction, and thus, it is possible to suppress the distribution of the magnetization in the initial state of the recording layer 13.

Figure 7:
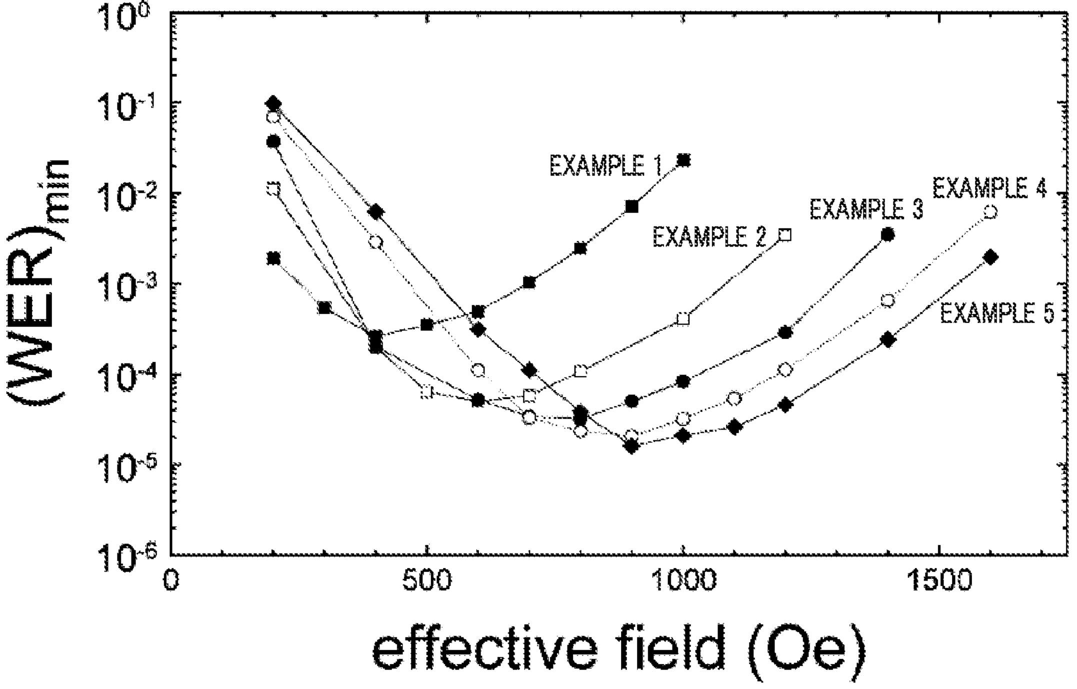
FIG. 7 illustrates write error rate calculation examples in the magnetic storage device according to Embodiment 1 (part 1)

FIG. 7 illustrates write error rate calculation examples in the magnetic storage device according to an embodiment of the present disclosure (part 1). The horizontal axis represents the effective magnetic field $H_{eff}$, and the vertical axis represents the minimum value of the write error rate $(WER)_{min}$. In each combination between the in-plane shape and the effective magnetic field in Examples 1 to 5, the minimum value $(WER)_{min}$ of the write error rate is obtained by calculating the voltage pulse duration $t_p$ dependence of the write error rate (WER) in a range of $K_{eff}^{(+V_1)}$=−200 to 50 $kJ/m^3$. The index ($M_s$ ($N_y$−$N_x$)) indicating the magnitude of the demagnetization field in the plane of the recording layer 13 is 510, 800, 1000, 1150 Oe in Examples 2 to 5, respectively. When the effective perpendicular magnetic field due to the perpendicular magnetic anisotropy is assumed to be $H_k^{eff}$ (=$^2K_{eff}/(\mu_0 M_s)$), $0.2\times H_k^{eff}$ becomes 460 Oe. FIG. 7 illustrates a case of $0.2\times H_k^{eff}<M_s(N_y-N_x)$ for Examples 2 to 5.

Referring to FIG. 7, the minimum values of the write error rate in Examples 2 to 5 are smaller than the minimum value of the write error rate in Example 1. In other words, in a case where the in-plane shape of the recording layer 13 is elliptical, applying the effective magnetic field $H_{eff}$ in the short axis direction in the plane makes it possible to reduce the write error rate more than in a case where the in-plane shape of the recording layer 13 is circular. Further, it can be seen that the minimum value of the write error rate decreases as the aspect ratio increases from Examples 1 to 5. For this reason, a larger aspect ratio is preferred. When the aspect ratio is too large, on the other hand, the recording layer is likely to reach a multi-magnetic domain state, which impairs the recording stability. Accordingly, the aspect ratio, in other words, L2/L1 in FIG. 2 is preferably in a range greater than 1 and equal to or less than 5, more preferably in a range of equal to or greater than 1.5 and equal to or less than 5, further preferably in a range of equal to or greater than 1.5 and equal to or less than 4, and particularly preferably in a range of equal to or greater than 2 and equal to or less than 3.5. Further, given the calculation results in Examples 2 to 5 illustrated in FIG. 7, the effective magnetic field $H_{eff}$ preferably satisfies a relation of $0.2\times H_k^{eff}<|H_{eff}|<M_s(N_y-N_x)$.

Figure 8A:
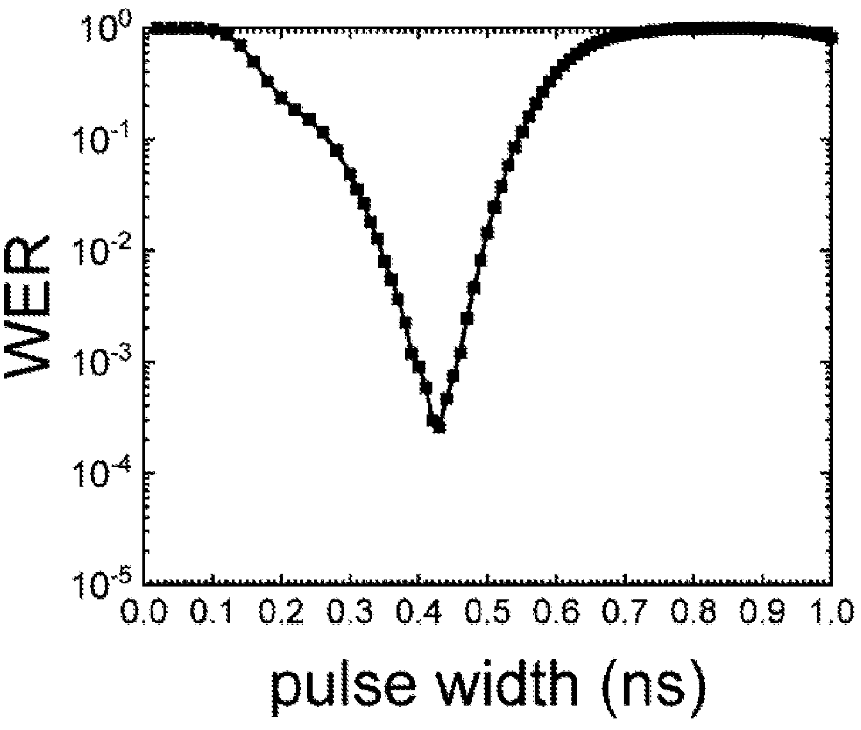
FIGS. 8A and 8B illustrate relations between the duration of the write voltage pulse and the write error rate in Embodiment 1.
Figure 8B:
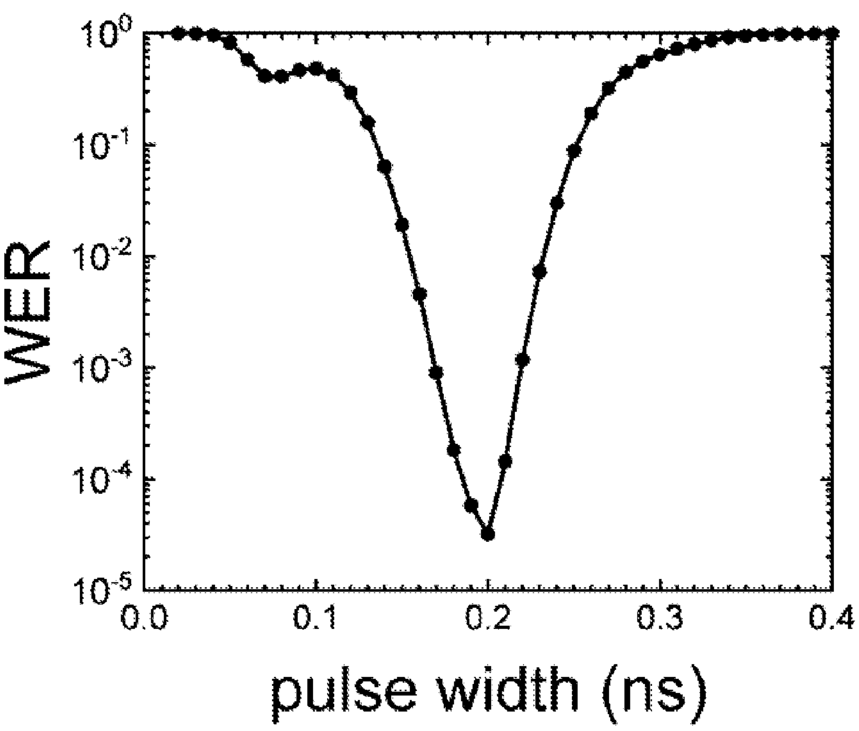

FIGS. 8A and 8B illustrate relations between the duration of the write voltage pulse and the write error rate. FIG. 8A illustrates a case where $K_{eff}^{(+V_1)}$ in Example 1 is 0 $kJ/m^3$, and FIG. 8B illustrates a case where $K_{eff}^{(+V_1)}$ in Example 3 is −60 $kJ/m^3$. The horizontal axis represents the duration of the voltage pulse, and the vertical axis represents the write error rate.

Referring to FIG. 8A, in the case of the recording layer having a circular shape in Example 1, the write error rate is minimum ($2.6\times10^{-4}$) when the duration of the write voltage pulse is 0.43 ns. In contrast, referring to FIG. 8B, in the case of the recording layer 13 having an elliptical shape in Example 3 and when an external magnetic field is applied in the short axis direction in the plane, the write error rate is minimum ($3.2\times10^{-5}$) when the duration of the write voltage pulse is approximately 0.20 ns. It can be seen that the write error rate in Example 3 is one order of magnitude lower than that in Example 1. Further, it can be seen that in Example 3, the duration of the write voltage pulse in which the write error rate is minimum is approximately 50% that in Example 1 and high-speed writing is possible.

Figures 9, 10:
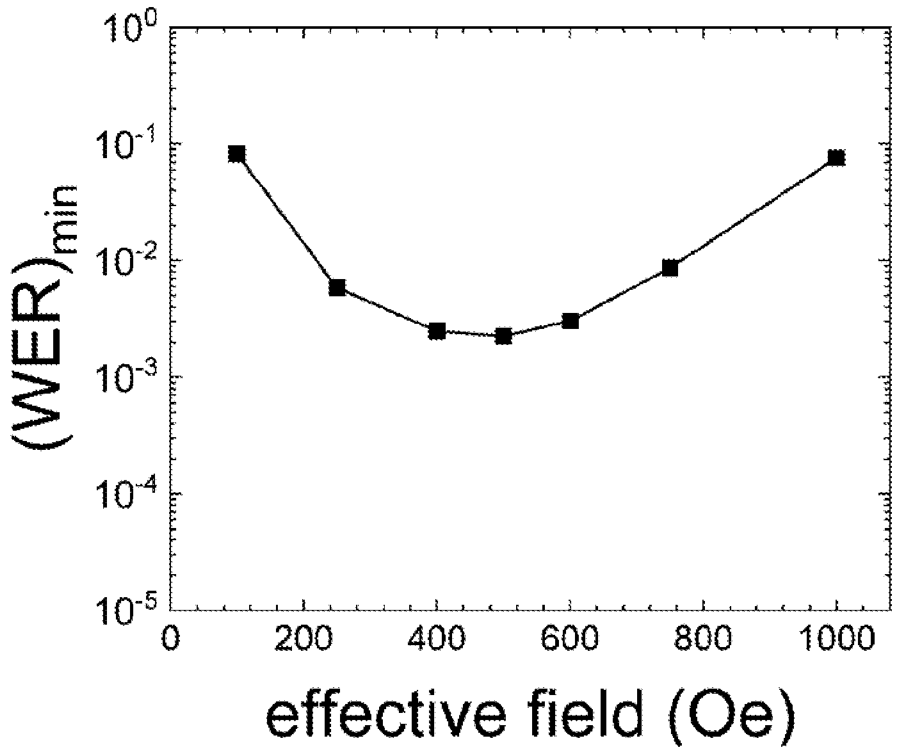
FIG. 9 illustrates a write error rate calculation example in the magnetic storage device according to Embodiment 1 (part 2)
FIG. 10 illustrates relations between the duration of the write voltage pulse and the write error rate in Embodiment 2.

FIG. 9 illustrates a write error rate calculation example in the magnetic storage device according to an embodiment of the present disclosure (part 2). The horizontal axis represents the effective magnetic field $H_{eff}$, and the vertical axis represents the minimum value of the write error rate $(WER)_{min}$. In FIG. 9, a simulation in a case where the index ($M_s$ ($N_y$−$N_x$)) indicating the magnitude of the demagnetization field in the plane of the recording layer 13 is smaller than $0.2\times H_k^{eff}$ of effective perpendicular magnetic field $H_k^{eff}$ due to the perpendicular magnetic anisotropy, in other words, in the case of $M_s(N_y-N_x)<0.2\times H_k^{eff}$ is conducted. The film thickness of the recording layer is assumed to be 0.5 nm, the junction area of the magnetoresistive element is assumed to be $900\pi$ $nm^2$, and the in-plane shape of the recording layer is assumed to be an elliptical shape with an aspect ratio of 2, which is a shape similar to that in Example 2. In this case, $M_s$ ($N_y$−$N_x$) is 180 Oe and $0.2\times H_k^{eff}$ is 460 Oe.

Referring to FIG. 9, it can be seen that the write error rate takes a minimum value when the effective magnetic field $H_{eff}$ is in the vicinity of approximately 450 Oe to approximately 520 Oe. Accordingly, it can be seen that in the case of $M_s(N_y-N_x)<0.2\times H_k^{eff}$, it is preferred that the effective magnetic field $H_{eff}$ be substantially equal to $0.2\times H_k^{eff}$, in other words, the effective magnetic field $H_{eff}$ preferably satisfies a relation of $M_s(N_y-N_x)<|H_{eff}|\cong 0.2\times H_k^{eff}$.

Embodiment 2

A magnetic storage device according to Embodiment 2 includes a magnetoresistive element which makes it possible to obtain a low write error rate even in a case where the accuracy of the duration of the write voltage pulse is lower than that in Embodiment 1. The schematic configuration of the main part of the magnetic storage device and a plan view of a recording layer of the magnetoresistive element according to Embodiment 2 are the same as those in FIGS. 1 and 2 in Embodiment 1, respectively, and thus, the same reference signs are used for the components, and illustrations and descriptions thereof will be omitted.

The magnetoresistive element 11 of the magnetic storage device according to Embodiment 2 falls under a case where the magnetic damping constant (Gilbert damping constant) a of the recording layer 13 is relatively large. The magnetoresistive element 11 including the recording layer 13 in which the Gilbert damping constant $\alpha$ is large makes it possible to reduce the write error rate by suppressing thermal fluctuation in the initial state. Further, since the write error rate is low over a long range of the duration of the write voltage pulse, there is an effect of requiring no high-precision duration for the write voltage pulse.

In a simulation for the magnetic storage device according to Embodiment 2, the following various parameters are applied with respect to the magnetoresistive element 11 and writing conditions.

Film thickness of the recording layer: 2 nm

Junction area of the magnetoresistive element: 19600π $nm^2$ (=$140^2$π $nm^2$)

In-plane shape of the recording layer and aspect ratio (Aspect Ratio (AR)=long axis/short axis):

Example 6: circular shape, AR=1 (as a comparative example),

Example 7: elliptical shape, AR=3 (Embodiment 2)

Demagnetizing factors ($N_x$, $N_y$, $N_z$):

Example 6 (0.01325, 0.01325, 0.97350),

Example 7 (0.00535, 0.02574, 0.96891)

Saturation magnetization $M_s$ of the recording layer: $1.400\times10^6$ A/m

Magnetic damping constant (Gilbert damping constant) α:

Example 6: α=0.17, Example 7: α=0.20

Effective magnetic field $H_{eff}$ (the short axis direction in the plane of the recording layer): 400 Oe Effective perpendicular magnetic anisotropy constant $K_{eff}$:

$K_{eff}^{(0)}$=70 kJ/$m^3$ when the applied voltage is zero, $K_{eff}^{(+V_1)}$ when the voltage pulse (applied voltage $V_1$) is applied:

Example 6: $K_{eff}^{(+V_1)}$=33 kJ/$m^3$, Example 7: $K_{eff}^{(+V_1)}$) =10 kJ/$m^3$ Duration $t_p$ of the voltage pulse: 0.5 ns to 10.0 ns FIG. 10 illustrates relations between the duration of the write voltage pulse and the write error rate in Embodiment 2. Referring to FIG. 10, the write error rate is low over a long range of 1.0 ns to 10.0 ns in the duration $t_p$ of the write voltage pulse in both Examples 6 and 7. Unlike the cases in Examples 1 and 3 illustrated in FIG. 8, this requires no high-precision control of the duration $t_p$. Such a writing method is called damping writing. In the damping writing, relaxation to a state after writing is caused in a short time by utilizing magnetic damping (friction in the magnetization motion), and thus, a is preferably equal to or greater than 0.05 and equal to or less than 0.5. To obtain this relatively large α, the recording layer 13 preferably contains at least one of Hf, Ta, W, Os, Ir, Pt, and Au, all of which are 5d transition metals.

When Examples 6 and 7 are compared, the write error rate in the case of Example 7 where the in-plane shape of the recording layer 13 is elliptical and the effective magnetic field $H_{eff}$ is applied in the short axis direction in the plane of the recording layer is two orders of magnitude lower than that in the case of Example 6 where the in-plane shape of the recording layer is circular and the effective magnetic field $H_{eff}$ is applied in the in-plane direction of the recording layer. In Example 7, the same effect as in Embodiment 1 is used to reduce the write error rate more than in Example 6. Accordingly, even in the damping writing, the effective magnetic field $H_{eff}$ preferably satisfies a relation of $0.2\times H_k^{eff}<|H_{eff}|<M_s\ (N_y-N_x)$ in the case of $0.2\times H_k^{eff}<M_s\ (N_y-N_x)$. In the case of $M_s\ (N_y-N_x)<0.2\times H_k^{eff}$, it is preferred that the effective magnetic field $H_{eff}$ be substantially equal to $0.2\times H_k^{eff}$, in other words, the effective magnetic field $H_{eff}$ preferably satisfies a relation of $M_s(N_y-N_x)<|H_{eff}|\cong0.2\times H_k^{eff}$.

In Example 7, an example in which $K_{eff}^{(0)}$=70 kJ/$m^3$ and $K_{eff}^{(+V_1)}$=33 kJ/$m^3$ has been indicated, but in a case where the in-plane shape of the recording layer 13 is elliptical, $K_{eff}^{(0)}$ and $K_{eff}^{(+V_1)}$ that satisfy the following relations are preferred for causing the damping writing.

(1) In the case of $h_{eff}\leq N_y-N_x$,

[5]

$$\kappa_{eff}^{(+V_1)} > 0 \text{ and } \kappa_{eff}^{(+V_1)} < \frac{h_{eff}^2 - 2h_{eff}m_y^{(0)}(N_y-N_x) + (N_y-N_x)\left[N_x - N_o - \left(m_y^{(0)}\right)^2(N_o-N_y)\right]}{2\left[1-\left(m_y^{(0)}\right)^2\right](N_y-N_x)} - \frac{1}{2}(N_y-N_x). \quad \text{(Equation 5)}$$

(2) In the case of $N_y-N_x<h_{eff}\leq2K_{eff}^{(0)}+N_y-N_x$,

[6]

$$\kappa_{eff}^{(+v_1)} > \frac{h_{eff}+N_x-N_y}{2} \text{ and } \kappa_{eff}^{(+v_1)} < \frac{h_{eff}}{m_y^{(0)}+1} - \frac{N_y-N_x}{2}. \quad \text{(Equation 6)}$$

Note that, the following dimensionless parameters are used here due to no dependence on the scale of the magnetic energy.

[7]

$$h_{eff} = H_{eff}/M_s,\ \kappa_{eff}^{(+V_1)} = K_{eff}^{(+V_1)}/\left(\mu_0 M_s^2\right),\ \kappa_{eff}^{(0)} = K_{eff}^{(0)}/\left(\mu_0 M_s^2\right),\ m_y^{(0)} - h_{eff}/\left(2\kappa_{eff}^{(0)}+N_y-N_x\right) \quad \text{(Equation 7)}$$

Embodiment 3

In a magnetic storage device according to Embodiment 3, the effective magnetic field to be applied to the recording layer 13 of the magnetoresistive element 11 includes, in addition to the direction of the short side in the plane of the recording layer 13 (the short axis direction in a case where the recording layer 13 has an elliptical shape), a component perpendicular to the film surface, that is, an out-of-plane component. The schematic configuration of the main part of the magnetic storage device and a plan view of a recording layer of the magnetoresistive element according to Embodiment 3 are the same as those in FIGS. 1 and 2 in Embodiment 1, respectively, and thus, the same reference signs are used for the components, and illustrations and descriptions thereof will be omitted.

In a simulation for the magnetic storage device according to Embodiment 3, the following various parameters are applied with respect to the magnetoresistive element 11 and writing conditions.

Film thickness of the recording layer: 1.1 nm

Junction area of the magnetoresistive element: 289π $nm^2$ (=$17^2$π $nm^2$)

In-plane shape of the recording layer and aspect ratio (Aspect Ratio (AR)=long axis/short axis):

Example 8: circular shape, AR=1 (as a comparative example),

Example 9: elliptical shape, AR=3

Demagnetizing factors ($N_x$, $N_y$, $N_z$):

Example 8 (0.04447, 0.04447, 0.91106),

Example 9 (0.01817, 0.08445, 0.89738)

Saturation magnetization $M_s$ of the recording layer: $0.955\times10^6$ A/m

Magnetic damping constant (Gilbert damping constant): α=0.1

Effective magnetic field $H_{eff}$:

Component in the out-of-plane (−z) direction of the recording layer: 100 Oe,

Component in the short axis direction in the plane of the recording layer:

Example 8: 400 Oe, Example 9: 800 Oe

Effective perpendicular magnetic anisotropy constant $K_{eff}$:

$K_{eff}^{(0)}$=110 kJ/m$^3$ when the applied voltage is zero, $K_{eff}^{(+V_1)}$ when the voltage pulse (applied voltage $V_1$) is applied:

Example 8, magnetization switching from the +z direction to the −z direction: $K_{eff}^{(+V_1)}$=38 kJ/m$^3$ Example 9, magnetization switching from the +z direction to the −z direction: $K_{eff}^{(+V_1)}$=26 kJ/m$^3$ Example 8, magnetization switching from the −z direction to the +z direction: $K_{eff}^{(+V_1)}$=−10 kJ/m$^3$ Example 9, magnetization switching from the −z direction to the +z direction: $K_{eff}^{(+V_1)}$=−80 kJ/m$^3$ Duration $t_p$ of the voltage pulse:

Examples 8 and 9, magnetization switching from the +z direction to the −z direction: $t_p$=10 ns Example 8, magnetization switching from the −z direction to the +z direction: $t_p$=0.37 ns Example 9, magnetization switching from the −z direction to the +z direction: $t_p$=0.18 ns Hereinafter, the magnetization switching direction from the +z direction to the −z direction will be referred to as the first magnetization switching direction, and the magnetization switching direction from the −z direction to the +z direction will be referred to as the second magnetization switching direction. In the present embodiment, an embodiment in which the out-of-plane component of the effective magnetic field $H_{eff}$ is set in the −z direction will be described.

In writing in which the first magnetization switching direction occurs, the magnetization direction in the final state is stabilized by the component of the effective magnetic field $H_{eff}$ in the −z direction, damping writing occurs, and the WER in Example 8 is 0.0378 and the WER in Example 9 is 0.0542, where the WERs are comparable.

In writing in which the second magnetization switching direction occurs, on the other hand, the magnetization direction in the final state is destabilized by the component of the effective magnetic field $H_{eff}$ in the −z direction. In Example 8, $(WER)_{min}$=0.00633 is obtained at $K_{eff}^{(+V_1)}$=−10 kJ/m$^3$ and $t_p$=0.37 ns, where $(WER)_{min}$ increases by approximately 24 times in comparison with $(WER)_{min}$=0.00026 in Example 1 in which the effective magnetic field $H_{eff}$ does not include the component in the −z direction. In Example 9, on the other hand, $(WER)_{min}$=0.00014 is obtained at $K_{eff}^{(+V_1)}$=−80 kJ/m$^3$ and $t_p$=0.18 ns, where $(WER)_{min}$ increases indeed, but increases only by approximately 4.3 times in comparison with $(WER)_{min}$=0.000032 in Example 3 in which the effective magnetic field $H_{eff}$ does not include the component in the −z direction.

Note that, in the present embodiment, the out-of-plane component of the effective magnetic field $H_{eff}$ may be set in the +z direction, in which case the magnetization switching direction from the −z direction to the +z direction is the first magnetization switching direction, the magnetization switching direction from the +z direction to the −z direction is the second magnetization switching direction, and the action and effect of the present embodiment described above are achieved.

Figure 11:
FIG. 11 is a schematic diagram of a magnetic storage device according to an embodiment of the present disclosure.
Figure 11:
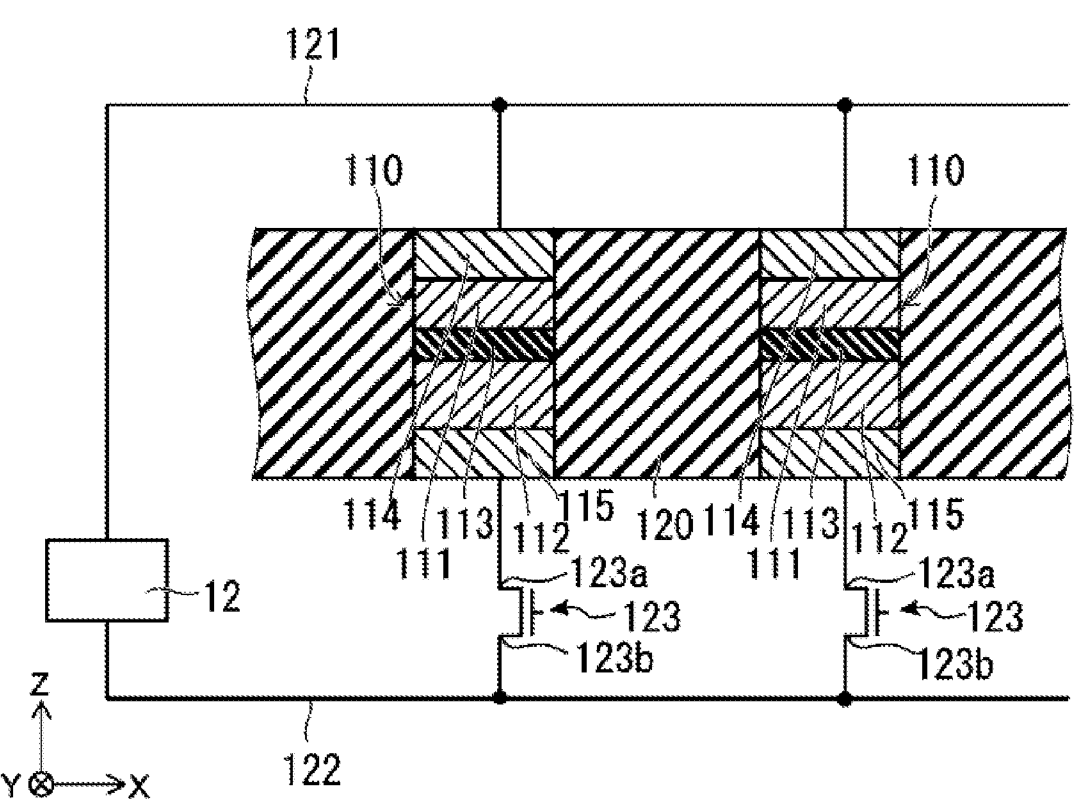

FIG. 11 is a schematic diagram of a magnetic storage device according to an embodiment of the present disclosure. Referring to FIG. 11 together with FIG. 1, a magnetic storage device 100 includes: a plurality of magnetoresistive elements 110 having the configuration of the magnetoresistive element 11 illustrated in FIG. 1; insulation units 120 that insulate and separate the magnetoresistive elements 110; the control unit 12; first wiring 121; second wiring 122; and switches 123. The control unit 12 performs writing by applying a voltage pulse for writing to each magnetoresistive element 110 via the first wiring 121, the second wiring 122, and the switches 123, and further performs reading by applying a voltage pulse for reading thereto. With respect to the control unit 12, the voltage pulse for writing is preferably a unipolar pulse, which enables bidirectional writing to the magnetoresistive element 110.

The magnetoresistive element 110 includes: a multilayer film 111 including a recording layer; a reference layer 112; a tunnel barrier layer 113 held between the multilayer film 111 and the reference layer 112; a first electrode 114 in contact with the upper side of the multilayer film 111; and a second electrode 115 in contact with the lower side of the reference layer 112. The first wiring 121 is electrically connected to the first electrode 114. A terminal 123*a*, which is one terminal of the switch 123, is electrically connected to the second electrode 115. A terminal 123*b*, which is the other terminal of the switch 123, is electrically connected to the second wiring 122.

The multilayer film 111 may include, for example, a stacked structure (not illustrated) of a magnetization free layer/a non-magnetic layer/a magnetization fixed layer, or may be a single layer as a magnetization free layer. The magnetoresistive element 110 may be provided with a cap layer, a protective film, a seed layer, a buffer layer, and/or the like (each of which is not illustrated) as appropriate.

The magnetic storage device 100 may be formed by stacking the first electrode 114 or the second electrode 115, a seed layer, a buffer layer, and/or the like on a substrate and stacking the multilayer film 111, the tunnel barrier layer 113, the reference layer 112, and/or the like thereon by a sputtering method, a vacuum vapor deposition method, a chemical vapor deposition (CVD) method or the like. Further, although the multilayer film 111 including the recording layer is above the reference layer 112 in FIG. 11, the multilayer film 111 may be stacked below the reference layer 112.

The magnetic storage device 100 may be formed by using a process technology, the so-called three-dimensional integration technology, in which the magnetoresistive element 110 is formed on a substrate, then a side of the magnetoresistive element 11 is pressure-bonded and joined to a circuit including the first wiring 121, the second wiring 122, the switch 123, and/or the like formed on another substrate, and finally the substrate is removed from the magnetoresistive element 110.

The first electrode 114 and the second electrode 115 are formed of a non-magnetic conductive material and include, for example, at least one element selected from the group consisting of Ta, Ru, W, Ir, Au, Ag, Cu, Al, Cr, Pt, and Pd. The thickness of the first electrode 114 and the second electrode 115 is preferably equal to or greater than 1 nm and equal to or less than 200 nm. The thickness ($th_{el}$) of the first electrode 114 and the second electrode 115 is more preferably greater than a length L1 of the short side SS or a length L2 of the long side LS in the in-plane shape of the recording layer 13 illustrated in FIG. 2 and equal to or less than 200 nm, in other words, L1 or L2<$th_{el}$≤200 nm. Thus, the first electrode 114 and the second electrode 115 obtain good flatness and a sufficiently low resistance value.

The insulation unit 120 contains a non-magnetic insulating compound. The insulating compound is, for example, an oxide, nitride, or fluoride of at least one element selected from the group consisting of Si, Al, Ti, Mg, and Ta.

Figure 12A:
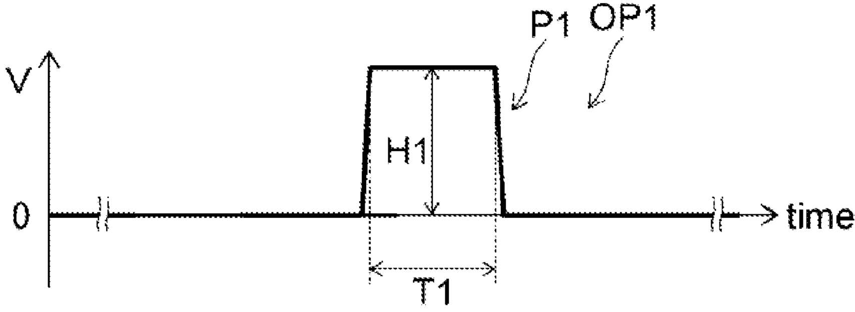
FIGS. 12A and 12B are explanatory diagrams of operation examples of a magnetic storage device according to an embodiment of the present disclosure (part 1)
Figure 12B:
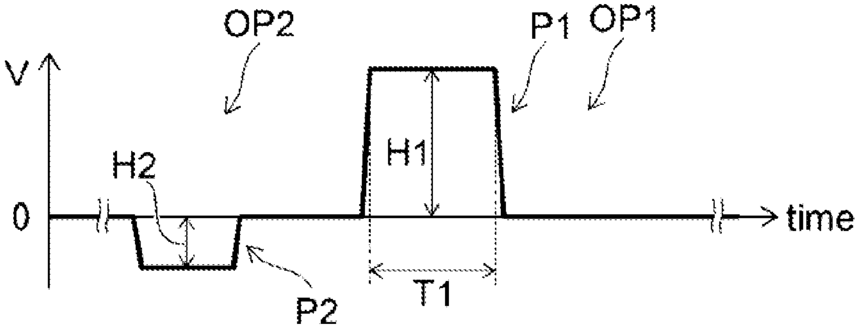

FIGS. 12A and 12B are explanatory diagrams of operation examples of a magnetic storage device according to an embodiment of the present disclosure (part 1). Hereinafter, a description will be given with reference to FIGS. 12A and 12B together with FIG. 11. The horizontal axis in FIGS. 12A and 12B represents time. The vertical axis in FIGS. 12A and 12B represents the voltage V of a signal to be applied between the first wiring 121 and the second wiring 122. The signal substantially corresponds to a signal to be applied between the multilayer film 111 including the recording layer and the reference layer 112 in the magnetoresistive element 110.

[Operation Examples of Writing and Reading]

Referring to FIG. 12A, the control unit 12 of the magnetic storage device 100 performs, as an example of a writing operation of information, a first operation OP1 of turning on (ON) a switch and applying a first pulse P1 (with a pulse height H1 and a pulse duration T1) between the first wiring 121 and the second wiring 122. In the first operation OP1, the first pulse P1 is supplied between the multilayer film 111 including the recording layer and the reference layer 112. The effective magnetic field described with reference to FIGS. 1 and 2 is applied to the recording layer 13. The effective magnetic field may be in a state of being applied regardless of the operation time of the first operation OP1, may be started to be applied even prior to performing the first operation OP1, or may be applied simultaneously with the first pulse P1. The magnetization of the recording layer included in the multilayer film 111 is reversed by the first pulse P1, the electrical resistance value between the multilayer film 111 and the reference layer 112 changes, and information stored in the magnetoresistive element 110 is rewritten. Note that, a change in the electrical resistance value between the multilayer film 111 and the reference layer 112 corresponds to a change in the electrical resistance value between the first electrode 114 and the second electrode 115 (that is, a change in the electrical resistance value of the magnetoresistive element 110) and further corresponds to a change in the electrical resistance value between the first wiring 121 and the second wiring 122.

When an electric resistance value R prior to supplying the first pulse P1 is assumed to be a first electric resistance value R1 and the electric resistance value R after supplying the first pulse P1 is assumed to be a second electric resistance value R2, the second electric resistance value R2 differs from the first electric resistance value R1. These electric resistance values R1 and R2 are based on relative directions between the magnetization of the recording layer included in the multilayer film 111 and the magnetization of the reference layer 112. For example, the electric resistance value R is higher in a case where the relative magnetization directions are antiparallel than in a case where the relative magnetization directions are parallel. Each of a plurality of states having mutually different electric resistance values R corresponds to information to be stored. The relative magnetization directions change due to the first operation OP1 and the electric resistance value R between the multilayer film 111 and the reference layer 112 changes.

Referring to FIG. 12B, the control unit 12 may perform, as a read operation of the stored information, a second operation OP2 of turning on the switch 123 and applying the second pulse P2 (with a pulse height H2) between the first wiring 121 and the second wiring 122 prior to performing the first operation OP1. The polarity of the second pulse P2 may be the same as or the reverse of the polarity of the first pulse P1. The case where the polarity of the second pulse P2 is the reverse of the polarity of the first pulse P1 is preferred from the viewpoint of preventing erroneous writing. Note that, in a case where the polarity of the second pulse P2 is the same as the polarity of the first pulse P1, the pulse height H2 is set to have a relation of $|H2|<|H1|$. The electric resistance value (a third electric resistance value R3) between the multilayer film 111 and the reference layer 112 after the second operation OP2 differs from the second electric resistance value R2 after the first operation OP1. The third electric resistance value R3 is, for example, the same as the first electric resistance value R1.

In a case where the second pulse P2 having a reverse polarity is used as described above, the absolute value ($|H2|$) of the height of the second pulse P2 may be smaller than, may be larger than, or may be the same as the absolute value ($|H1|$) of the height of the first pulse P1 (write pulse). Thus, since the magnetic anisotropy of the recording layer is controlled based on the voltage in the present embodiment, a change in the magnetization direction of the recording layer at the time of reading can be suppressed by using the second pulse having a polarity that is the reverse of the polarity of the first pulse P1.

For example, even in a case where the absolute value of the height of the second pulse P2 is the same as the absolute value of the height of the first pulse, the absolute value of the difference between electric resistance values R prior to and after the application of the second pulse P2 in the second operation OP2 (that is, the absolute value of the difference between the first electric resistance value R1 and the third electric resistance value R3) is smaller than the absolute value of the difference between the electric resistance values prior to and after the application of the first pulse in the first operation OP1 (that is, the absolute value of the difference between the first electric resistance value R1 and the second electric resistance value R2). In other words, rewriting of information does not occur even when the second pulse P2 having a polarity that is the reverse of the polarity of the first pulse P1 is applied as a voltage pulse having the same height as the first pulse P1.

Note that, in a case where information is not supposed to be rewritten, the control unit 12 may perform the second operation OP2 and then perform an operation in which the first operation OP1 is not performed.

Rewriting of information of the magnetoresistive element 110 is possible by the control unit 12 applying the first pulse P1 with the pulse height H1 and the duration T1 to the magnetoresistive element 110, and the magnetoresistive element 110 changes from the high resistance state to the low resistance state or from the low resistance state to the high resistance state. An appropriate pulse height H1 can be determined by performing the first operation OP1 a plurality of times or more number of times to measure the electric resistance values R1 and R2 prior thereto and thereafter and determining the probability of obtaining the desired changes. The lower pulse height H1 is, the lower power consumption becomes. The highest value of the pulse height H1 outputtable by the control unit 12 is preferably equal to or less than 1.8 V, more preferably equal to or less than 1.5 V, even more preferably equal to or less than 1.2 V, still more preferably equal to or less than 0.9 V, and particularly preferably equal to or less than 0.7 V.

In the writing in Embodiment 1 and in the writing in Embodiment 3 in which magnetization switching of the second magnetization switching direction occurs, the application of the first pulse P1 with a duration twice the appropriate duration T1, that is, with a duration of 2×T1 causes a reduction of a probability of a change in the electric resistance value occurring when comparing before and after the pulse application, and is therefore inappropriate. In the writing in Embodiment 2 and in the writing in Embodiment 3 in which magnetization switching of the first magnetization switching direction occurs, on the other hand, the duration of the first pulse P1 may be longer than the appropriate duration T1. Having said that, it is not preferable to increase the pulse duration unnecessarily since the power consumption increases as the duration becomes longer. Further, in Embodiments 1 to 3, a duration shorter than the appropriate duration T1, for example, a duration equal to or less than 30% of T1 is not preferable.

Figure 13:
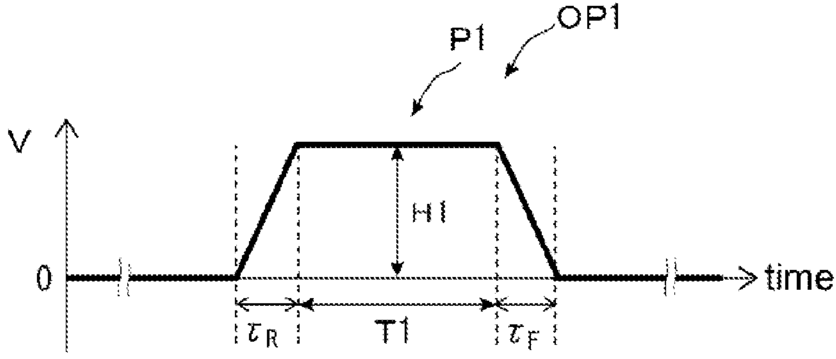
FIG. 13 is an explanatory diagram of an operation example of a magnetic storage device according to an embodiment of the present disclosure (part 2)

FIG. 13 is an explanatory diagram of an operation example of a magnetic storage device according to an embodiment of the present disclosure (part 2). Hereinafter, a description will be given with reference to FIG. 13 together with FIG. 11. The horizontal and vertical axes in FIG. 13 are the same as those in FIG. 12.

Referring to FIG. 13, the write pulse of the first operation OP1 is a pulse with the duration T1, but includes a time $\tau_R$ required for rising to reach the predetermined height H1, and a time $\tau_F$ required for falling to the voltage of 0. For example, in the writing in Embodiments 1 and 2, and the writing in which the second magnetization switching direction occurs in Embodiment 3, the time $\tau_R$ is preferably the same as or smaller than the time $\tau_F$. The time $\tau_R$ is preferably as short as possible from the viewpoint of write stabilization and is preferably close to zero. In Embodiments 1 to 3, the time $\tau_F$ is preferably longer, but it is preferred that the time $\tau_F$ not be excessively long from the viewpoint of power consumption, and that the time $\tau_F$ be substantially equal to or greater than 0 ns and equal to or less than 10 ns. Note that, although illustration is omitted, the times required for rising and falling of the second pulse P2 of the second operation OP2 illustrated in FIG. 12B are also the same as the time required for falling of the first pulse P1.

Although preferred embodiments of the present disclosure have been described in detail above, the present disclosure is not limited to such specific embodiments, and various variations and changes can be made within the scope of the present disclosure described in the accompanying claims. For example, a plurality of embodiments described above may be combined with each other. Note that, the macrospin simulations described above are conducted using a simulation program created in C language.

The disclosure of Japanese Patent Application No. 2022-016669, filed on Feb. 4, 2022, including the specification, drawings and abstract, is incorporated herein by reference in its entirety.

REFERENCE SIGNS LIST

10, 100 Magnetic storage device
11, 110 Magnetoresistive element
12 Control unit
13 Recording layer
14, 113 Tunnel barrier layer
15, 112 Reference layer
111 Multilayer film

The invention claimed is:

1. A magnetic storage device, comprising:

a magnetoresistive element including a stacked structure of a recording layer, a tunnel barrier layer, and a reference layer, the recording layer including a first magnetic layer, the reference layer including a second magnetic layer; and a control unit, wherein an in-plane shape of the recording layer is a shape in which a rectangle circumscribing the in-plane shape and having a minimum area includes a short side and a long side which have mutually different lengths, and when writing to the recording layer is performed, the control unit applies a voltage pulse to the magnetoresistive element while applying an effective magnetic field in a direction of the short side in a plane of the recording layer, wherein the effective magnetic field expressed as $H_{eff}$ satisfies a relation of $0.2\times H_k^{eff}<|H_{eff}|<M_s(N_y-N_x)$, and wherein $H_k^{eff}$ is an effective perpendicular magnetic field due to a perpendicular magnetic anisotropy, $M_s$ is a saturation magnetization of the recording layer, $N_x$ is a demagnetizing factor of a direction of the long side, and $N_y$ is a demagnetizing factor of the direction of the short side.

2. The magnetic storage device according to claim 1, wherein the voltage pulse when the writing to the recording layer is performed is a unipolar pulse voltage and application of the unipolar voltage pulse causes bidirectional magnetization switching.

3. The magnetic storage device according to claim 2, wherein the recording layer has a perpendicular magnetic anisotropy.

4. The magnetic storage device according to claim 2, wherein the recording layer contains Co—Fe—B.

5. The magnetic storage device according to claim 2, wherein the recording layer contains at least one of Hf, Ta, W, Os, Ir, Pt, and Au.

6. The magnetic storage device according to claim 2, wherein the effective magnetic field further includes a component perpendicular to a film surface of the recording layer.

7. The magnetic storage device according to claim 2, wherein the tunnel barrier layer is an oxide containing Mg.

8. The magnetic storage device according to claim 2, wherein the tunnel barrier layer is an oxide containing Mg and Al.

9. The magnetic storage device according to claim 2, wherein the tunnel barrier layer has a thickness equal to or greater than 1.2 nm.

10. The magnetic storage device according to claim 1, wherein the recording layer has a perpendicular magnetic anisotropy.

11. The magnetic storage device according to claim 1, wherein the recording layer contains Co—Fe—B.

12. The magnetic storage device according to claim 1, wherein the recording layer contains at least one of Hf, Ta, W, Os, Ir, Pt, and Au.

13. The magnetic storage device according to claim 1, wherein the effective magnetic field further includes a component perpendicular to a film surface of the recording layer.

14. The magnetic storage device according to claim 1, wherein the tunnel barrier layer is an oxide containing Mg.

15. The magnetic storage device according to claim 1, wherein the tunnel barrier layer is an oxide containing Mg and Al.

16. The magnetic storage device according to claim 1, wherein the tunnel barrier layer has a thickness equal to or greater than 1.2 nm.

17. The magnetic storage device according to claim 1, wherein the in-plane shape of the recording layer has a ratio L2/L1 greater than 1 and equal to or less than 5, wherein the L1 is a length of the short side of the rectangle and the L2 is a length of the long side of the rectangle.

18. The magnetic storage device according to claim 1, wherein the in-plane shape of the recording layer has a ratio L2/L1 equal to or more than 1.5 and equal to or less than 5, wherein the L1 is a length of the short side of the rectangle and the L2 is a length of the long side of the rectangle.

* * * * *